(12) United States Patent
Hayashi et al.

(10) Patent No.: US 7,833,682 B2
(45) Date of Patent: Nov. 16, 2010

(54) REFLECTIVE MASK BLANK FOR EUV LITHOGRAPHY AND SUBSTRATE WITH FUNCTIONAL FILM FOR THE SAME

(75) Inventors: Kazuyuki Hayashi, Chiyoda-ku (JP); Kazuo Kadowaki, Chiyoda-ku (JP); Takashi Sugiyama, Chiyoda-ku (JP); Masaki Mikami, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 262 days.

(21) Appl. No.: 12/198,912

(22) Filed: Aug. 27, 2008

(65) Prior Publication Data

US 2008/0318140 A1 Dec. 25, 2008

Related U.S. Application Data

(63) Continuation of application No. PCT/JP2007/062064, filed on Jun. 8, 2007.

(30) Foreign Application Priority Data

Jun. 8, 2006 (JP) .............................. 2006-159414

(51) Int. Cl.
*G03F 1/00* (2006.01)
*B32B 17/06* (2006.01)

(52) U.S. Cl. ......................................... 430/5; 428/428
(58) Field of Classification Search ...................... 430/5, 430/322, 323, 324; 428/428, 430; 378/35
See application file for complete search history.

(56) References Cited

U.S. PATENT DOCUMENTS

| 6,479,195 | B1 | 11/2002 | Kirchauer et al. |
| 7,172,788 | B2 * | 2/2007 | Yakshin et al. ............... 427/162 |
| 2004/0196579 | A1 | 10/2004 | Shoki |
| 2004/0224526 | A1 | 11/2004 | Shoki |
| 2005/0026046 | A1 | 2/2005 | Yan |
| 2007/0160874 | A1 | 7/2007 | Hayashi et al. |

FOREIGN PATENT DOCUMENTS

| EP | 1 498 936 | 1/2005 |
| JP | 2002-122981 | 4/2002 |
| JP | 2005-268750 | 9/2005 |

OTHER PUBLICATIONS

U.S. Appl. No. 12/483,785, filed Jun. 12, 2009, Hayashi, et al.

* cited by examiner

*Primary Examiner*—Stephen Rosasco
(74) *Attorney, Agent, or Firm*—Oblon, Spivak, McClelland, Maier & Neustadt, L.L.P.

(57) ABSTRACT

To provide an EUV mask blank of which the decrease in the reflectance during EUV exposure is suppressed, and a substrate with a functional film to be used for production of such an EUV mask blank.

A substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); and in the protective layer, the Ru content is from 70 at % to 95 at % and the total content of B and Zr is from 5 at % to 30 at %.

17 Claims, 2 Drawing Sheets

REFLECTIVE MASK BLANK FOR EUV LITHOGRAPHY AND SUBSTRATE WITH FUNCTIONAL FILM FOR THE SAME

TECHNICAL FIELD

The present invention relates to a reflective mask blank for EUV (Extreme Ultraviolet) lithography (hereinbelow, referred to as "EUV mask blank" in this Description) to be used for semiconductor manufacturing or the like, a substrate with a functional film to be used for production of the EUV mask blank, and an EUV mask prepared by forming a pattern on the EUV mask blank.

BACKGROUND ART

In the semiconductor industry, a photolithography method using visible light or ultraviolet light has been employed as a technique for writing, on a silicon substrate or the like, a fine pattern, which is required for writing an integrated circuit comprising such a fine pattern. However, the conventional exposure techniques using light exposure have been close to the limit of the conventional photolithography method while semiconductor devices have had finer patterns at an accelerated pace. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, has been considered as being promising as the exposure technique for 45 nm or below. In this Description, it should be noted that the phrase "EUV light" means a ray having a wavelength in a soft X ray region or a vacuum ultraviolet ray region, specifically a ray having a wavelength of about 10 to 20 nm, in particular, of about 13.5 nm±0.3 nm.

It is impossible to use EUV light in conventional dioptric systems as in photolithography using visible light or ultraviolet light since EUV light is apt to be absorbed by any substances and since the refractive index of the substances is close to 1 at the above wavelength. For this reason, a catoptric system, i.e., a combination of a reflective photomask and a mirror, is employed in EUV light lithography.

A mask blank is a stacked member to be used for fabrication of a photomask, which has not been patterned yet. In the case of an EUV mask blank, it has a structure wherein a substrate made of glass or the like has a reflective layer for reflecting EUV light and an absorber layer for absorbing EUV light, formed thereon in this order. The reflective layer normally comprises a reflective multilayer film, which comprises molybdenum (Mo) layers as high refractive layers and silicon (Si) layers as low refractive layers alternately stacked to increase a light reflectance when irradiating a layer surface with EUV light.

The absorber layer comprises a material having a high absorption coefficient to EUV light, specifically, for example, a material containing chromium (Cr) or tantalum (Ta) as the main component.

Between the reflective layer and the absorber layer, usually a protective layer is formed to prevent the surface of the reflective layer from being oxidized. As a material of the protective layer, Si has been widely used. On the other hand, Patent Document 1 proposed use of material (Ru) as the material of the protective layer.

In a case where Ru is used as the material of the protective layer, a high etching selectivity of the absorber layer will be obtained and further, a high reflectance will be obtained as compared with a case where a Si film is used as the protective layer. However, in a case where Ru is used as the material of the protective layer, a diffusion layer will be formed between the Ru protective layer and the outermost Si layer of the reflective multilayer film in a heating step (e.g. resist baking step) in production of a mask or during EUV exposure, and further, the diffusion layer will be oxidized, thus leading to a decrease in the reflectance of the reflective layer.

Particularly, since the decrease in the reflectance during EUV exposure proceeds with time, the exposure conditions should be changed during operation, or the life of the mask may be shortened.

In order to solve such problems, Patent Document 2 proposes a protective layer made of a ruthenium compound (Ru content of from 10 to 95 at %) containing Ru and at least one member selected from Mo, Nb, Zr, Y, B, Ti and La.

It is disclosed that by using such a protective layer, formation of a diffusion layer between the protective layer made of the ruthenium compound and a Si layer as the outermost layer of the reflective multilayer film in a heating step (resist baking) in production of a mask can be suppressed.

Patent Document 1: JP-A-2002-122981
Patent Document 2: JP-A-2005-268750

DISCLOSURE OF THE INVENTION

Object to be Accomplished by the Invention

However, in the case of the protective layer disclosed in Patent Document 2, it is not clear whether the decrease in the reflectance during EUV exposure is suppressed, and there is such a problem that since the element such as Mo contained in the ruthenium compound provides a high etching rate as compared with Ru, if the content of such an element is high, the etching properties of the protective layer tend to deteriorate.

To solve the above problems of prior art, it is an object of the present invention to provide an EUV mask blank of which the decrease in the reflectance during EUV exposure is suppressed, and a substrate with a functional film to be used for production of such an EUV mask blank.

Means to Accomplish the Object

The present inventors have conducted extensive studies to accomplish the above object and as a result, found that by making the protective layer containing Ru as a material have an amorphous structure, formation of a diffusion layer between a protective layer and a Si layer as the outermost layer of a reflective multilayer film can be suppressed, and the decrease in the reflectance during EUV exposure can be suppressed.

Further, the present inventors have found that to make the protective layer have an amorphous structure, it is effective that the protective layer contains Ru and at least one member selected from the group consisting of boron (B) and zirconium (Zr) and that the ratio of the respective components is within a specific range.

The present invention has been accomplished on the basis of the above discoveries, and provides a substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); and in the protective layer, the Ru content is from 70 at % to 95 at % and the total content of B and Zr is from 5 at % to 30 at %.

The present invention further provides a substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); the protective layer is a gradient composition film wherein the total content of B and Zr in the protective layer changes along the thickness direction of the protective layer so that the total content of B and Zr is high on the reflective layer side and the total content of B and Zr is low on the surface side; the total content of B and Zr is from 5 at % to 30 at % on the reflective layer side; and the total content of B and Zr is from 0 at % to 20 at % on the surface side.

Hereinafter in this Description, the above substrates with a reflective layer for EUV lithography will sometimes be referred to as a "substrate with a reflective layer of the present invention".

In the substrate with a reflective layer of the present invention, the protective layer is preferably in an amorphous state.

Further, the present invention provides a substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); in the protective layer, the Ru content is from 70 at % to 95 at % and the total content of B and Zr is from 5 at % to 30 at %; and the protective layer has an amorphous structure.

The present invention further provides a substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); the protective layer is a gradient composition film wherein the total content of B and Zr in the protective layer changes along the thickness direction of the protective layer so that the total content of B and Zr is high on the reflective layer side and the total content of B and Zr is low on the surface side; the total content of B and Zr is from 5 at % to 30 at % on the reflective layer side; the total content of B and Zr is from 0 at % to 20 at % on the surface side; and the protective layer has an amorphous structure.

Hereinafter in this Description, the above substrates with a reflective layer for EUV lithography also will sometimes be referred to as a "substrate with a reflective layer of the present invention".

In the substrate with a reflective layer of the present invention, the protective layer preferably comprises any one of the following solid-solutions:

a solid solution of Ru and B, a solid solution of Ru and Zr, and a solid solution of Ru, B and Zr In the substrate with a reflective layer of the present invention, in a case where the protective layer contains Ru and B, the protective layer preferably keeps being in an amorphous state up to 200° C. in vacuum (at most 1 Pa).

In the substrate with a reflective layer of the present invention, in a case where the protective layer contains Ru and Zr, the protective layer preferably keeps being in an amorphous state up to 400° C. in vacuum (at most 1 Pa).

In the substrate with a reflective layer of the present invention, the surface roughness on the surface of the protective layer is preferably at most 0.5 nm rms.

In the substrate with a reflective layer of the present invention, the protective layer preferably has a thickness of from 1 to 10 nm.

The present invention further provides a reflective mask blank for EUV lithography comprising the above substrate with a reflective layer of the present invention and an absorber layer formed on the protective layer of the substrate (hereinafter sometimes referred to as a "EUV mask blank of the present invention").

In the EUV mask blank of the present invention, the absorber layer is preferably made of a material containing tantalum (Ta) as the main component.

In the EUV mask blank of the present invention, the etching selectivity of the absorber layer to the protective layer is preferably at least 10 in the case of plasma etching.

In the EUV mask blank of the present invention, a low reflective layer to inspection light to be used for inspection of a mask pattern is preferably formed by a material containing tantalum (Ta) as the main component on the absorber layer.

In a case where the low reflective layer is formed on the absorber layer, the contrast as between the reflected light on the surface of the protective layer and the reflected light on the surface of the low reflective layer at a wavelength of light to be used for inspection of a pattern to be formed on the absorber layer, is preferably at least 30%.

The present invention still further provides a reflective mask for EUV lithography prepared by forming a pattern on the above EUV mask blank of the present invention (hereinafter sometimes referred to as a "EUV mask of the present invention").

Effects of the Invention

In the substrate with a reflective layer of the present invention, formation of a diffusion layer between a protective layer and a Si layer as the outermost layer of a reflective multilayer film at the time of forming the protective layer can be suppressed. Thus, the decrease in the reflectance by formation of a diffusion layer can be suppressed.

In the EUV mask blank of the present invention, formation of a diffusion layer between a protective layer and a Si layer as the outermost layer of a reflective multilayer film at the time of heat treatment such as resist baking can be suppressed. Thus, the decrease in the reflectance by formation of a diffusion layer can be suppressed.

In the EUV mask of the present invention, formation of a diffusion layer between a protective layer and a Si layer as the outermost layer of a reflective multilayer film during EUV exposure can be suppressed. Thus, the decrease in the reflectance by formation of a diffusion layer can be suppressed. Accordingly, the EUV mask of the present invention is a highly reliable EUV mask with a small change in the reflectance with time.

MEANINGS OF SYMBOLS

1: EUV mask blank
11: substrate
12: reflective layer (reflective multilayer film)
13: protective layer
14: absorber layer
15: low reflective layer

BEST MODE FOR CARRYING OUT THE INVENTION

Now, the EUV mask blank of the present invention will be described with reference to the drawings.

Figure 1:
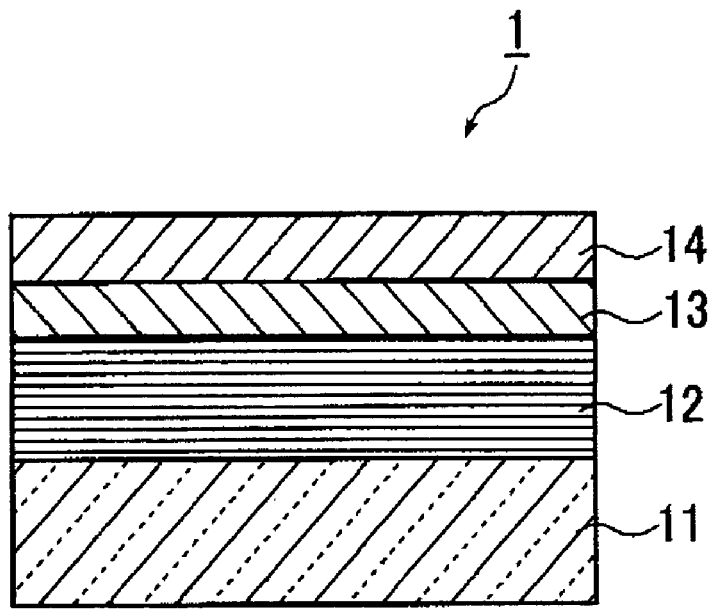
FIG. 1 is a cross-section schematically illustrating an embodiment of an EUV mask blank of the present invention.

FIG. 1 is a cross-section schematically illustrating one embodiment of the EUV mask blank of the present invention. A mask blank 1 shown in FIG. 1 comprises a substrate 11, and a reflective layer 12 for reflecting EUV light and a protective layer 13 for protecting the reflective layer formed in this order on the substrate 11. On the protective layer 13, an absorber layer 14 is formed.

Now, the respective constituents in the mask blank 1 will be described.

The substrate 11 is required to satisfy properties as a substrate for an EUV mask blank. Accordingly, the substrate 11 is preferably one having a low coefficient of thermal expansion (preferably $0 \pm 1.0 \times 10^{-7}/°$ C., more preferably $0 \pm 0.3 \times 10^{-7}/°$ C., furthermore preferably $0 \pm 0.2 \times 10^{-7}/°$ C., still more preferably $0 \pm 0.1 \times 10^{-7}/°$ C., particularly preferably $0 \pm 0.05 \times 10^{-7}/°$ C.) and being excellent in smoothness, flatness and resistance to a cleaning liquid to be used e.g. for a mask blank or a photomask after formation of a pattern. As the substrate 11, specifically, glass having a low coefficient of thermal expansion, such as a $SiO_2$—$TiO_2$ glass may be used, but the substrate is not limited thereto, and a substrate made of crystallized glass with a β quartz solid solution precipitated therein, quartz glass, silicon, metal or the like may also be used. Further, a film such as a stress correcting film may be formed on the substrate 11.

The substrate 11 preferably has a smooth surface of at most 0.15 nm rms and a flatness of at most 100 nm, with a view to obtaining a high reflectance and printing precision in a photomask after pattern formation.

The dimensions, the thickness and the like of the substrate 11 are properly determined according to the designed values of a mask or the like. In Examples described hereinafter, a $SiO_2$—$TiO_2$ glass having outer dimensions of 6 inch (152.4 mm) square and a thickness of 0.25 inch (6.3 mm) was used.

It is preferred that no defects are present on the surface of the substrate 11 on a side where the reflective layer 12 is formed. However, even when defects are present, it is preferred that the depth of the concave defects and the height of the convex defects are at most 2 nm and that the half value width of the concave defects and the convex defects is at most 60 nm, in order that no phase defects are formed by the concave defects and/or the convex defects.

The reflective layer 12 is not particularly limited so long as it has properties as desired as a reflective layer for an EUV mask blank. The property that is particularly required for the reflective layer 12 is that it is a film having a high EUV light reflectance. Specifically, when the reflective layer 12 is irradiated with a ray in the wavelength range of the EUV light at an angle of incidence of 6°, the maximum reflectance to light having a wavelength in the vicinity of 13.5 nm is preferably at least 60%, more preferably at least 65%. Further, even when a protective layer 13 is formed on the reflective layer 12, the maximum reflectance to light having a wavelength in the vicinity of 13.5 nm is preferably at least 60%, more preferably at least 65%.

As the reflective layer 12, usually a reflective multilayer film having high refractive index layers and low refractive index layers alternately stacked several times is used, which achieves a high EUV light reflectance. In the reflective multilayer film for the reflective layer 12, Mo is widely used for the high refractive index layers and Si is widely used for the low refractive index layers. That is, a Mo/Si reflective multilayer film is most commonly used. However, the reflective multilayer film is not limited thereto, and for example, a Mo compound/Si compound reflective multilayer film may also be used.

The thicknesses and the number of repeating units of the layers constituting the reflective multilayer film for the reflective layer 12 are properly selected depending upon the film material used and the EUV light reflectance required for the reflective layer. In the case of a Mo/Si reflective layer as an example, in order that the reflective layer 12 has a maximum EUV light reflectance of at least 60%, Mo layers having a thickness of 2.3±0.1 nm and Si layers having a thickness of 4.5±0.1 nm are stacked with a number of repeating units of from 30 to 60 to form the reflective multilayer film.

The respective layers constituting the reflective multilayer film for the reflective layer 12 may be formed to have desired thicknesses by a known film deposition method such as magnetron sputtering or ion beam sputtering. For example, in the case of forming a Si/Mo reflective multilayer film by ion beam sputtering, it is preferred to deposit a Si film so as to have a thickness of 4.5 nm, using a Si target as the target and an Ar gas (having a gas pressure of $1.3 \times 10^{-2}$ Pa to $2.7 \times 10^{-2}$ Pa) as the sputtering gas, with an ion acceleration voltage of from 300 to 1,500 V at a deposition rate of from 0.03 to 0.30 nm/sec, and then to form a Mo film so as to have a thickness of 2.3 nm, using a Mo target as the target and an Ar gas (having a gas pressure of from $1.3 \times 10^{-2}$ Pa to $2.7 \times 10^{-2}$ Pa) as the sputtering gas with an ion acceleration voltage of from 300 to 1,500 V at a deposition rate of from 0.03 to 0.30 nm/sec. By stacking Si films and Mo films in 40 to 50 cycles, each of the cycles comprising the above steps, the Si/Mo reflective multilayer film is deposited.

The protective layer 13 is formed for the purpose of protecting the reflective layer 12 from being damaged by an etching process during pattern formation on the absorber layer 14 by etching process, usually by plasma etching process, and for the purpose of preventing the surface of the reflective layer 12 from being oxidized. The protective layer 13 itself preferably has a high EUV light reflectance so as not to impair the EUV light reflectance of the reflective layer 12 even after formation of the protective layer 13.

In the EUV mask blank 1, the protective layer 13 contains ruthenium (Ru) and at least one member selected from the group consisting of boron (B) and zirconium (Zr), with a ratio of these components within a specific range described hereinafter. In the protective layer 13, Ru and at least one member selected from the group consisting of B and Zr form any one of the following solid solutions. Here, a solid solution is one having two or more elements dissolve in each other to be an entirely uniform solid phase, and does not include an intermetallic compound having a crystal lattice, etc.:

A solid solution of Ru and B (solid solution (A))
A solid solution of Ru and Zr (solid solution (B))
A solid solution of Ru, B and Zr (solid solution (C))

In the protective layer 13 i.e. in the above solid solution, it is preferred that the Ru content is from 70 at % to 95 at % and the total content of B and Zr is from 5 at % to 30 at %, whereby Ru, B and Zr hardly form a compound having a crystal lattice in the protective layer 13 and thus, the protective layer 13 is hardly in an amorphous state. Accordingly, in the case of the solid solution (A), the Ru content is preferably from 70 at % to 95 at % and the B content is preferably from 5 at % to 30 at %, whereby the protective layer 13 is likely to be in an amorphous state. In the case of the solid solution (B), the Ru content is preferably from 70 at % to 95 at % and the Zr content is preferably from 5 at % to 30 at %, whereby the protective layer 13 is likely to be in amorphous state. In the case of the solid solution (C), the Ru content is preferably from 70 at % to 95 at % and the total content of B and Zr is preferably from 5 at % to 30 at %, whereby the protective layer 13 is likely to be in an amorphous state.

The protective layer 13 may contain an element other than Ru, B and Zr so long as it has technical effects as a protective layer.

The reason why the protective layer 13 is in an amorphous state when each of the above solid solutions (A) and (B) have the above Ru, B and Zr contents is considered as follows.

It is considered that the protective layer 13 (solid solution) tends to be in an amorphous state when it has the above Ru and B contents, since the difference in the volume of atoms (the difference in the atomic radius) contained in the solid solution is great. Further, it is considered that when the solid solution has the above Ru and Zr contents, it has a composition near the eutectic point and accordingly when a protective layer 13 is formed, the solid solution is rapidly cooled, whereby the protective layer 13 is in an amorphous state.

In the above solid solution, when the Ru content and the total content of B and Zr are within the above range, the protective layer 13 is in an amorphous state. In the above solid solution, if the total content of B and Zr is less than 5 at %, the contents of B and Zr are too low, whereby the protective layer 13 is not in an amorphous state. On the other hand, if the total content of B and Zr exceeds 30 at %, the etching resistance of the protective layer 13 tends to be poor. Further, if the Zr content is too high, the etching rate tends to be high, and if the Zr content is high, the protective layer will easily be oxidized. Further, if the B content is too high, preparation of a sputtering target to be used for formation of the protective layer 13 tends to be difficult.

In Patent Document 2, Mo, Nb, etc. are placed on the same level with B and Zr. However, as a result of studies by the present inventors, it was found that the deposition rates of Ti and Nb are significantly different from that of Ru, and an increase of addition amount of Ti or Nb is practically difficult. Further, with respect to Mo, deposition conditions to make the protective layer be in an amorphous state have not yet been found.

Namely, it is estimated that dopants disclosed in Patent Document 2 are specified considering only one aspect of effects, but it was found that they are not practically useful dopants. In other words, Patent Document 2 merely exemplifies dopants which seem to be usable without technical judgment whether they can be practically useful or not. Thus, Patent Document 2 failed to disclose which dopant is practically useful to those skilled in the art and is considered not to qualify as prior art.

In the above solid solution, it is preferred that the Ru content is from 80 at % to 95 at % and the total content of B and Zr is from 5 at % to 20 at %, more preferably the Ru content is from 80 at % to 90 at % and the total content of B and Zr is from 10 at % to 20 at %.

In this Description, "the protective layer 13 is in an amorphous state" includes a microcrystal structure in addition to an amorphous structure without no crystal structure at all.

The protective layer 13 being in an amorphous state i.e. having an amorphous structure or having a microcrystal structure can be confirmed by X-ray diffraction (XRD). When the protective layer 13 has an amorphous structure or a microcrystal structure, no sharp peak will be observed on a diffraction peak obtainable by an XRD measurement.

In the EUV mask blank 1 of the present invention, by the protective layer 13 being in an amorphous state, formation of a diffusion layer between the outermost layer of the reflective multilayer film for the reflective layer 12 and the protective layer 13 is suppressed. In a case where the protective layer 13 has a crystal structure, it is considered that a diffusion layer is formed by diffusion of Si in a Si layer which is common as the outermost layer of the reflective multilayer film from continuous grain boundaries in the protective layer 13. It is considered that when the protective layer 13 has an amorphous structure or a microcrystal structure, since no grain boundaries are present or grain boundaries are discontinuous, diffusion of Si hardly occurs, and formation of a diffusion layer is suppressed. It is preferred that the protective layer is in an amorphous state particularly in the vicinity of the interface with the outermost layer of the reflective multilayer film for the reflective layer 12.

It is considered that an effect of suppressing formation of a diffusion layer will be achieved when the protective layer 13 has an amorphous structure or a microcrystal structure near the interface between the protective layer 13 and the outermost layer of the reflective multilayer film for the reflective layer 12. Accordingly, the entire protective layer 13 does not necessarily have an amorphous structure or a microcrystal structure. For example, the protective layer 13 has an amorphous structure or a microcrystal structure only on the reflective layer 12 side, and may have a crystal structure on the absorber layer 14 side (i.e. on the surface side of the protective layer 13). Thus, the protective layer 13 may be a gradient composition film described hereinafter. However, also in a case where the protective layer 13 is a gradient composition film, the entire protective layer 13 preferably has an amorphous structure or a microcrystal structure. When the entire protective layer 13 has an amorphous structure or a microcrystal structure, the surface of the protective layer 13 is excellent in smoothness since the protective layer 13 has an amorphous structure or a microcrystal structure on its surface side.

In this Description, in a case where the protective layer 13 is a gradient composition film, the total content of B and Zr in the solid solution for the protective layer 13 changes along the thickness direction of the protective layer 13 so that the total content of B and Zr is high on the reflective layer 12 side and the total content of B and Zr is low on the absorber layer 14 side (i.e. on the surface side of the protective layer 13). The solid solution for the protective layer 13 may be any of the above solid solutions (A) to (C).

The following effects will be achieved when the protective layer 13 is a gradient composition film.

Since the protective film 13 has an amorphous structure or a microcrystal structure on the reflective layer 12 side, an effect of suppressing formation of a diffusion layer will be achieved. Further, by the low contents of B and Zr on the surface side of the protective layer 13, oxidation on the surface of the protective layer 13 can be suppressed. If the B or Zr content is high on the surface side of the protective layer 13, the surface of the protective layer 13 tends to be easily oxidized.

In order to achieve the above effects, the gradient composition film for the protective film 13 has the following composition.

(1) On the reflective layer 12 side, the total content of B and Zr in the protective layer 13 i.e. in the solid solution is from 5 at % to 30 at %.

(2) On the surface side (on the absorber layer 14 side in FIG. 1) of the protective layer 13, the total content of B and Zr in the protective layer 13 i.e. in the solid solution is from 0 at % to 20 at %.

Accordingly, the protective layer 13 may not contain B or Zr on the surface side.

In the gradient composition film for the protective layer 13, the portion having the composition (1) is preferably from 1 to 1.5 nm, more preferably from 1 to 2 nm in thickness from the surface on the reflective layer 12 side. Further, it is preferred that the Ru content is from 80 at % to 95 at % and the total content of B and Zr is from 5 at % to 20 at %, more preferably the Ru content is from 85 at % to 95 at % and the total content of B and Zr is from 5 at % to 15 at %. On the other hand, the portion having the composition (2) is preferably from 1 to 1.5 nm, more preferably from 1 to 2 nm in thickness from the surface on the absorber layer 14 side. Further, it is preferred that the Ru content is from 85 at % to 100 at % and the total content of B and Zr is from 0 at % to 15 at %, more preferably the Ru content is from 90 at % to 95 at % and the total content of B and Zr is from 5 at % to 10 at %.

The gradient composition film may be one in which the total content of B and Zr in the protective layer 13 i.e. in the solid solution continuously changes along the thickness direction of the protective layer 13 or may be a laminate of a plurality of layers differing in the total content of B and Zr in the solid solution.

As described above, it is in a heating step (e.g. resist baking step) at the time of preparation of a mask or during EUV exposure that a diffusion layer may be formed. Accordingly, the protective layer 13 is required to keep having an amorphous structure or a microcrystal structure during such conditions. Since formation of a diffusion layer during EUV exposure makes it necessary to change the exposure conditions during the exposure, it is particularly important that the protective layer 13 keeps having an amorphous structure or a microcrystal structure during EUV exposure.

When the protective layer 13 contains Ru and B, i.e. in the case of the solid solution (A), the protective layer 13 can keep being in an amorphous state up to 200° C. in vacuum (at most 1 Pa).

In such a case, the exposure conditions are set so that the temperature of heating the protective layer 13 will be at most 200° C. during EUV exposure. On the other hand, in a case where the protective layer 13 contains Ru and Zr, i.e. in the case of the solid solution (B), the protective layer 13 can keep being in an amorphous state up to 400° C. in vacuum (at most 1 Pa). In such a case, the exposure conditions are set so that the temperature of heating the protective layer 13 will be at most 400° C. during EUV exposure.

In a case where the protective layer 13 is a gradient composition film, the above is applied to a portion having an amorphous structure or a microcrystal structure on the originally formed protective layer 13, i.e. the reflective layer side of the protective layer 13.

In the EUV mask blank 1 of the present invention, formation of a diffusion layer between the protective layer 13 and the outermost layer of the reflective multilayer film for the reflective layer 12 is suppressed at the time of irradiation with EUV, and accordingly the decrease in the reflectance at the time of irradiation with EUV is suppressed. Specifically, the decrease in the reflectance after irradiation with EUV light at an angle of incidence θ (6°) for 8 hours is preferably at most 1%, more preferably at most 0.8%, furthermore preferably at most 0.5%.

Since the protective layer 13 has an amorphous structure or a microcrystal structure, the surface roughness on the surface of the protective layer 13 is at most 0.5 nm rms. If the surface roughness on the surface of the protective layer 13 is great, the surface roughness of the absorber layer 14 to be formed on the protective layer 13 tends to be significant, and the edge roughness of a pattern to be formed on the absorber layer 14 tends to be significant, thus deteriorating the dimensional accuracy of the pattern. Since the influence of the edge roughness tends to increase as the pattern becomes fine, the surface of the absorber layer 14 is required to be smooth.

When the surface roughness on the surface of the protective layer 13 is at most 0.5 nm rms, the surface of the absorber layer 14 to be formed on the protective layer 13 will be sufficiently smooth, and accordingly, the dimensional accuracy of the pattern will not be deteriorated by the influence of the edge roughness. The surface roughness on the surface of the protective layer 13 is more preferably at most 0.4 nm rms, more preferably at most 0.3 nm rms.

The thickness of the protective layer 13 is preferably from 1 to 10 nm with a view to increasing the EUV light reflectance and obtaining etching resistance. The thickness of the protective layer 13 is more preferably from 1 to 5 nm, furthermore preferably from 2 to 4 nm.

It is disclosed in Patent Document 2 that formation of a diffusion layer can be prevented by adding Mo or the like to the Ru layer, since a Ru film is likely to form a diffusion layer with a Si film.

However, according to studies by the present inventors, it was found that formation of the diffusion layer with a Si layer cannot be prevented only by addition of a certain metal to the Ru film. Detailed description is as follows.

Patent Document 2 specifically exemplifies, as metals to be added to the Ru layer, Zr and B in addition to Mo, and discloses specific examples in Example 5 (RuZr) and Examples 10 to 13 (RuB). However, the Zr content is 50 at % in Example 5, and in Examples 10 to 13, the B content is so high as 30 at % (Example 10), 50 at % (Example 11), 60 at % (Example 12) and 66 at % (Example 13). That is, in Examples 5 and 10 to 13, the Ru content is very low, and properties which the Ru layer originally has cannot be obtained with such a low content.

Further, in Examples 5 and 10 to 13, the material of the protective layer is considered to be an intermetallic compound from the composition, and according to studies by the present inventors, it was found that an intermetallic compound, which has a certain crystal structure, has insufficient properties of preventing diffusion of Si and as a result, it is difficult to suppress a decrease in the reflectance.

Whereas, in the present invention, by the protective layer containing Ru and at least one member selected from the group consisting of B and Zr with contents of the respective components within a specific range, the amount of Ru contained in the protective layer can be secured to a certain extent or more and in addition, diffusion of Si can be prevented by making the protective layer have an amorphous structure, and as a result, the decrease in the reflectance can be suppressed.

Namely, the present invention is characterized in that the protective layer contains ruthenium (Ru) and at least one element selected from the group consisting of boron (B) and zirconium (Zr), that the Ru content in the protective layer is from 70 at % to 95 at %, that the total content of B and Zr is from 5 at % to 30 at %, and that the protective layer has an amorphous structure.

Further, the present invention is characterized in that the protective layer contains Ru and at least one element selected from the group consisting of B and Zr, that the protective layer is a gradient composition film wherein the total content of B and Zr in the protective layer changes along the thickness direction of the protective layer so that the total content of B and Zr is high on the reflective layer side and the total content of B and Zr is low on the surface side, that the total content of B and Zr is from 5 at % to 30 at % on the reflective layer side, that the total content of B and Zr is from 0 at % to 20 at % on the surface side, and that the protective layer has an amorphous structure.

The protective layer 13 can be formed by a known film deposition method such as magnetron sputtering or ion beam sputtering.

In a case where the protective layer 13 comprising the above solid solution (A) is formed by magnetron sputtering, using a Ru target and a B target as targets, these targets are simultaneously discharged in an atmosphere of argon (Ar). Specifically, magnetron sputtering is carried out under the following conditions.

Sputtering gas: Ar (gas pressure: $1.0 \times 10^{-1}$ to $10 \times 10^{-1}$ Pa, preferably $1.0 \times 10^{-1}$ to $5.0 \times 10^{-1}$ Pa, more preferably $1.0 \times 10^{-1}$ to $3.0 \times 10^{-1}$ Pa)

Electric powder applied (for each target): 30 to 1,000 W, preferably 50 to 750 W, more preferably 80 to 500 W Deposition rate: 1.0 to 60 nm/sec, preferably 1.0 to 45 nm/sec, more preferably 1.0 to 30 nm/sec In a case where a protective layer 13 comprising the above solid solution (B) is formed by magnetron sputtering, by using a Ru target and a Zr target as targets, these targets are simultaneously discharged in an Ar atmosphere. Specifically, magnetron sputtering is carried out under the following conditions.

Sputtering gas: Ar (gas pressure: $1.0 \times 10^{-1}$ to $10 \times 10^{-1}$ Pa, preferably $1.0 \times 10^{-1}$ to $5.0 \times 10^{-1}$, more preferably $1.0 \times 10^{-1}$ to $3.0 \times 10^{-1}$ Pa)

Electric powder applied (for each target): 30 to 1,000 W, preferably 50 to 750 W, more preferably 80 to 500 W Deposition rate: 1.0 to 60 nm/sec, preferably 1.0 to 45 nm/sec, more preferably 1.0 to 30 nm/sec The property that is particularly required for the absorber layer 14 is a very low EUV light reflectance. Specifically, when the absorber layer 14 is irradiated with a ray in the wavelength range of the EUV light, the maximum reflectance to light having a wavelength in the vicinity of 13.5 nm is preferably at most 0.5%, more preferably at most 0.1%.

In order to achieve the above property, the absorber layer 14 is preferably made of a material having a high absorption coefficient to EUV light, more preferably made of a material containing tantalum (Ta) as the main component.

Such an absorber layer 14 may be one containing Ta, B, Si and nitrogen (N) in the following contents (TaBSiN film).

B content: at least 1 at % and less than 5 at %, preferably 1 to 4.5 at %, more preferably 1.5 to 4 at %.

Si content: 1 to 25 at %, preferably 1 to 20 at %, more preferably 2 to 12 at %.

Compositional ratio of Ta to N (Ta:N) 8:1 to 1:1

Ta content: preferably 50 to 90 at %, more preferably 60 to 80 at %.

N content: preferably 5 to 30 at %, more preferably 10 to 25 at %.

An absorber layer 14 having the above composition is in an amorphous state and is excellent in surface smoothness.

Of the absorber layer 14 having the above composition, the surface roughness is at most 0.5 nm rms. If the surface roughness on the surface of the absorber layer 14 is great, the edge roughness of a pattern to be formed on the absorber layer tends to be significant, thus deteriorating the dimensional accuracy of the pattern. Since the influence of the edge roughness tends to increase as the pattern becomes fine, the surface of the absorber layer 14 is required to be smooth.

When the surface roughness on the surface of the absorber layer 14 is at most 0.5 nm rms, the surface of the absorber layer 14 is sufficiently smooth, and accordingly the dimensional accuracy of the pattern will not be deteriorated by the influence of the edge roughness. The surface roughness on the surface of the absorber layer 14 is more preferably at most 0.4 nm rms, furthermore preferably at most 0.3 nm rms.

The thickness of the absorber layer 14 is preferably from 50 to 100 nm. The absorber layer 14 having the above structure can be formed by a known film deposition method, e.g. sputtering such as magnetron sputtering or ion beam sputtering. In the case of magnetron sputtering, the absorber layer 14 can be formed by any of the following methods (1) to (3).

(1) Using a Ta target, a B target and a Si target, the respective targets are simultaneously discharged in an atmosphere of nitrogen ($N_2$) diluted with Ar to form the absorber layer 14.

(2) Using a TaB compound target and a Si target, these targets are simultaneously discharged in an atmosphere of $N_2$ diluted with Ar to form the absorber layer 14.

(3) Using a TaBSi compound target, the target comprising these three elements combined is discharged in an atmosphere of $N_2$ diluted with Ar to form the absorber layer 14.

Among the above-described methods, in the methods ((1) and (2)) of discharging two or more targets simultaneously, the composition of the absorber layer 14 to be formed can be controlled by adjusting the electric power applied to the respective targets.

Among the above methods, the methods (2) and (3) are preferred with a view to avoiding unstable discharge or dispersion of the composition and the thickness of the film, and the method (3) is particularly preferred. The TaBSi compound target particularly preferably has a composition of Ta=50 to 94 at %, Si=5 to 30 at % and B=1 to 20 at %, with a view to avoiding unstable discharge and the dispersion of the composition and the thickness of the film.

To form the absorber layer 14 by the above exemplified method, specifically, film deposition is carried out under the following film deposition conditions.

Method (2) Using TaB Compound Target and Si Target

Sputtering gas: gas mixture of Ar and $N_2$ ($N_2$ gas concentration: 3 to 80 vol %, preferably 5 to 30 vol %, more preferably 8 to 15 vol %; gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied (for each target): 30 to 1,000 W, preferably 50 to 750 W, more preferably 80 to 500 W Deposition rate: 2.0 to 60 nm/sec, preferably 3.5 to 45 nm/sec, more preferably 5 to 30 nm/sec Method (3) Using TaBSi Compound Target Sputtering gas: gas mixture of Ar and $N_2$ ($N_2$ gas concentration: 3 to 80 vol %, preferably 5 to 30 vol %, more preferably 8 to 15 vol %; gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Figure 2:
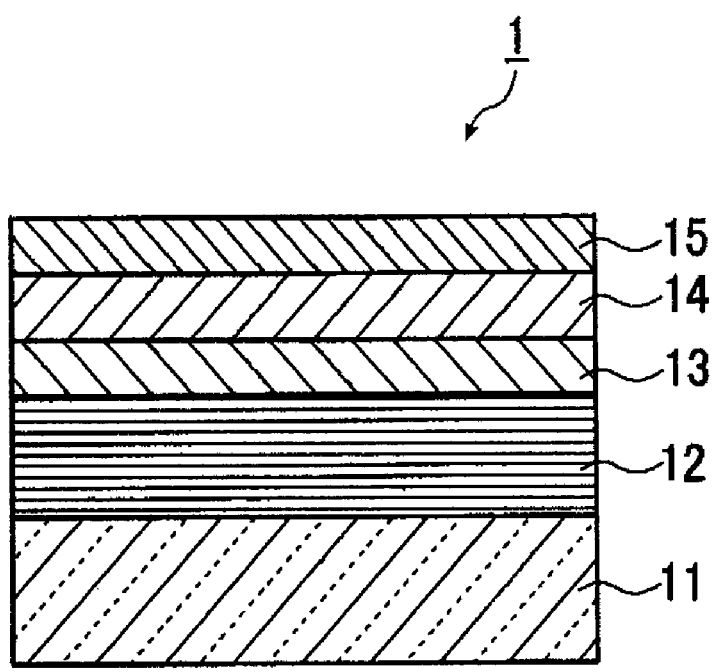
FIG. 2 is a cross-section schematically illustrating an embodiment of an EUV mask blank of the present invention, which has a low reflective layer formed on an absorber layer.

Electric power applied: 30 to 1,000 W, preferably 50 to 750 W, more preferably 80 to 500 W Deposition rate: 2.0 to 60 nm/sec, preferably 3.5 to 45 nm/sec, more preferably 5 to 30 nm/sec The EUV mask blank of the present invention preferably comprises, as shown in FIG. 2, a low reflective layer 15 to inspection light to be used for inspection of a mask pattern, formed on the absorber layer 14.

At the time of preparation of an EUV mask, after a pattern is formed on the absorber layer, the EUV mask is inspected whether the pattern is formed as designed. For inspection of the mask pattern, an inspection machine usually employing a light at a wavelength of about 257 nm as inspection light is used. That is, the EUV mask is inspected by the difference in the reflectance to this light at a wavelength of about 257 nm, specifically by the difference in the reflectance between on the exposed face from which the absorber layer 14 is removed by the pattern formation and on the surface of the absorber layer 14 remaining without being removed by pattern formation. The former face corresponds to the surface of the protective layer 13. Thus, if the difference in the reflectance between on the surface of the protective layer 13 and on the surface of the absorber layer 14 to light at a wavelength of the inspection light is small, the contrast tends to be poor at the time of inspection and accurate inspection will not be conducted.

The absorber layer 14 having the above-described structure has a very low EUV light reflectance and has excellent properties as the absorber layer for the EUV mask blank 1, but with respect to the wavelength of the inspection light, its light reflectance is not necessarily sufficiently low. Thus, the difference between the reflectance on the surface of the absorber layer 14 and the reflectance on the surface of the protective layer 13 at a wavelength of the inspection light is small, and no sufficient contrast may be obtained at the time of inspection. If no sufficient contrast can be obtained at the time of inspection, defects of the pattern cannot sufficiently be judged at the time of mask inspection, and the defect test cannot be conducted accurately.

By forming a low reflective layer 15 on the absorber layer 14, a favorable contrast will be obtained at the time of inspection, that is, the light reflectance at the wavelength of the inspection light is very low. The low reflective layer 15 formed for such a purpose has, when irradiated with a ray in the wavelength range of the inspection light, a maximum light reflectance at the wavelength of the inspection light of preferably at most 15%, more preferably at most 10%, furthermore preferably at most 5%.

When the low reflective layer 15 has a light reflectance of at most 15% at a wavelength of the inspection light, a favorable contrast at the time of inspection will be obtained. Specifically, the contrast between the reflected light at a wavelength of the inspection light on the surface of the protective layer 13 and the reflected light at a wavelength of the inspection light on the surface of the low reflective layer 15, is at least 40%.

In this Description, the contrast can be determined by the following formula.

Contrast(%)=(($R_2$-$R_1$)/($R_2$+$R_1$))×100

Figure 3:
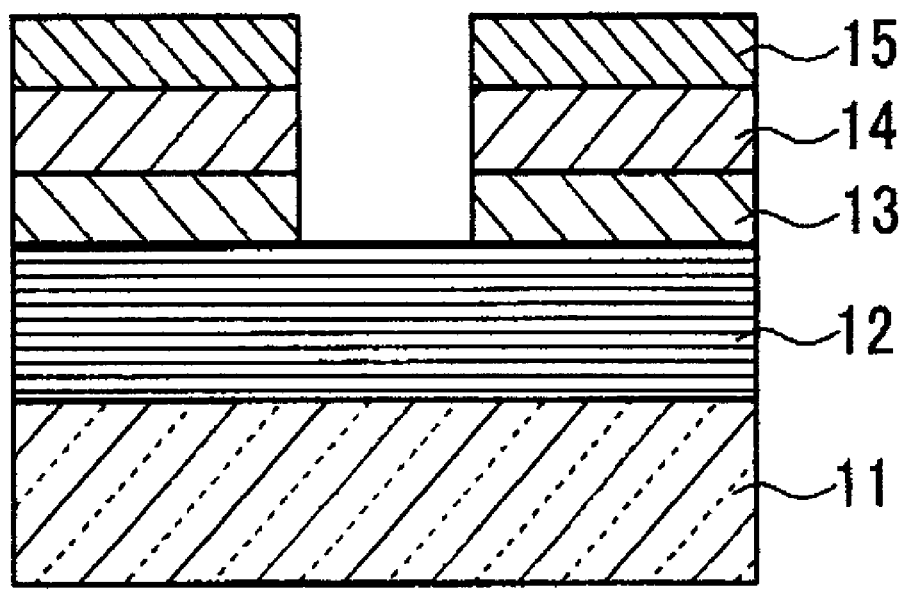
FIG. 3 illustrates a state where a pattern is formed on an absorber layer 14 (and a low reflective layer 15) of an EUV mask blank 1 shown in FIG. 2.

$R_2$ at a wavelength of the inspection light is the reflectance on the surface of the protective layer 13, and $R_1$ is the reflectance on the surface of the low reflective layer 15. The above $R_1$ and $R_2$ are measured in a state where a pattern is formed on the absorber layer 14 and the low reflective layer 15 of the EUV mask blank 1 shown in FIG. 2 (i.e. a state shown in FIG. 3). The above $R_2$ is a value measured on the surface of the protective layer 13 exposed to the outside, from which the absorber layer 14 and the low reflective layer 15 are removed by pattern formation in FIG. 3, and $R_1$ is a value measured on the surface of the low reflective layer 15 remaining without being removed by pattern formation.

In the present invention, the contrast represented by the above formula is more preferably at least 45%, furthermore preferably at least 60%, particularly preferably at least 80%.

The low reflective layer 15 is preferably made of a material presenting a lower refractive index at a wavelength of the inspection light than that of the absorber layer 14, and it is preferably in an amorphous state in order to achieve the above properties.

As a specific example of such a low reflective layer 15, one containing Ta, B, Si and oxygen (O) in the following contents (low reflective layer (TaBSiO)) may be mentioned.

B content: at least 1 at % and less than 5 at %, preferably 1 to 4.5 at %, more preferably 1.5 to 4 at %.

Si content: 1 to 25 at %, preferably 1 to 20 at %, more preferably 2 to 10 at %.

Compositional ratio of Ta to O (Ta:O) 7:2 to 1:2, preferably 7:2 to 1:1, more preferably 2:1 to 1:1

Further, as a specific example of the low reflective layer 15, one containing Ta, B, Si, O and N in the following ratio (low reflective layer (TaBSiON)) may be mentioned.

B content: at least 1 at % and less than 5 at %, preferably 1 to 4.5 at %, more preferably 2 to 4.0 at %.

Si content: 1 to 25 at %, preferably 1 to 20 at %, more preferably 2 to 10 at %.

Compositional ratio of Ta to O and N (Ta:(O+N)) 7:2 to 1:2, preferably 7:2 to 1:1, more preferably 2:1 to 1:1

The low reflective layer (TaBSiO) or (TaBSiON) having the above structure is in an amorphous state and has a surface excellent in smoothness. Specifically, the surface roughness on the surface of the low reflective layer (TaBSiO) or (TaBSiON) is at most 0.5 nm rms.

As described above, the surface of the absorber layer is required to be smooth, in order to prevent deterioration of the dimensional accuracy of the pattern by the influence of the edge roughness. Since the low reflective layer 15 is formed on the absorber layer 14, its surface is required to be smooth from the same reason.

When the surface roughness on the surface of the low reflective layer 15 is at most 0.5 nm rms, the dimensional accuracy of the pattern will not be deteriorated by the influence of the edge roughness, since the surface of the low reflective layer 15 is sufficiently smooth. The surface roughness on the surface of the low reflective layer 15 is more preferably at most 0.4 nm rms, furthermore preferably at most 0.3 nm rms.

In the case of forming the low reflective layer 15 on the absorber layer 14, the total thickness of the absorber layer 14 and the low reflective layer 15 is preferably from 55 to 130 nm. Further, the low reflective layer 15 is preferably thinner than the absorber layer 14 since the EUV light absorption properties of the absorber layer 14 may decrease if the low reflective layer 15 is thicker than the absorber layer 14. Accordingly, the thickness of the low reflective layer 15 is preferably from 5 to 30 nm, more preferably from 10 to 20 nm.

The low reflective layer (TaBSiO) or (TaBSiON) can be formed by a known film deposition method, e.g. sputtering such as magnetron sputtering or ion beam sputtering. In the case of magnetron sputtering, the low reflective layer (TaBSiO) can be formed by any of the following methods (1) to (3).

(1) Using a Ta target, a B target and a Si target, the respective targets are simultaneously discharged in an atmosphere of oxygen ($O_2$) diluted with argon (Ar) to form the low reflective layer (TaBSiO).

(2) Using a TaB compound target and a Si target, these targets are simultaneously discharged in an atmosphere of oxygen diluted with argon to form the low reflective layer (TaBSiO).

(3) Using a TaBSi compound target, the target comprising these three elements combined is discharged in an atmosphere of oxygen diluted with argon to form the low reflective layer (TaBSiO).

Among the above described methods, in the methods ((1) and (2)) of discharging two or more targets simultaneously, the composition of the low reflective layer (TaBSiO) to be formed can be controlled by adjusting the electric power applied to the respective targets.

Among the above methods, the methods (2) and (3) are preferred with a view to avoiding unstable discharge or the dispersion of the composition and the thickness of the film, and the method (3) is particularly preferred. The TaBSi compound target particularly preferably has a composition of Ta=50 to 94 at %, Si=5 to 30 at % and B=1 to 20 at %, with a view to avoiding unstable discharge and the dispersion of the composition and the thickness of the film.

In a case where the low reflective layer (TaBSiON) is formed, the same procedure as above is carried out in an atmosphere of an oxygen/nitrogen gas mixture diluted with argon instead of in an atmosphere of oxygen diluted with argon.

To form the low reflective layer (TaBSiO) by the above method, specifically, film deposition is carried out under the following deposition conditions.

Method (2) Using TaB Compound Target and Si Target

Sputtering gas: gas mixture of Ar and $O_2$ ($O_2$ gas concentration: 3 to 80 vol %, preferably 5 to 30 vol %, more preferably 8 to 15 vol %, gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied (for each target): 30 to 1,000 W, preferably 50 to 750 W, more preferably 80 to 500 W Deposition rate: 2.0 to 60 nm/sec, preferably 3.5 to 45 nm/sec, more preferably 5 to 30 nm/sec Method (3) Using TaBSi Compound Target Sputtering gas: gas mixture of Ar and $O_2$ ($O_2$ gas concentration: 3 to 80 vol %, preferably 5 to 30 vol %, more preferably 8 to 15 vol %, gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied: 30 to 1,000 W, preferably 50 to 750 W, more preferably 80 to 500 W Deposition rate: 2.0 to 50 nm/sec, preferably 2.5 to 35 nm/sec, more preferably 5 to 25 nm/sec To form the low reflective layer (TaBSiON) by the above method, specifically, film deposition is carried out under the following film deposition conditions.

Method (2) Using TaB Compound Target and Si Target

Sputtering gas: gas mixture of Ar, $O_2$ and $N_2$ ($O_2$ gas concentration: 5 to 30 vol %, $N_2$ gas concentration: 5 to 30 vol %, preferably $O_2$ gas concentration: 6 to 25 vol %, $N_2$ gas concentration: 6 to 25 vol %, more preferably $O_2$ gas concentration: 10 to 20 vol %, $N_2$ gas concentration: 15 to 25 vol %; gas pressure: $1.0 \times 10^{-2}$ Pa to $10 \times 10^{-2}$ Pa, preferably $1.0 \times 10^{-2}$ Pa to $5 \times 10^{-2}$ Pa, more preferably $1.0 \times 10^{-2}$ Pa to $3 \times 10^{-2}$ Pa)

Electric power applied (for each target): 30 to 1,000 W, preferably 50 to 750 W, more preferably 80 to 500 W Deposition rate: 2.0 to 50 nm/sec, preferably 2.5 to 35 nm/sec, more preferably 5 to 25 nm/sec Method (3) Using TaBSi Compound Target Sputtering gas: gas mixture of Ar, $O_2$ and $N_2$ ($O_2$ gas concentration: 5 to 30 vol %, $N_2$ gas concentration: 5 to 30 vol %, preferably $O_2$ gas concentration: 6 to 25 vol %, $N_2$ gas concentration: 6 to 25 vol %, more preferably $O_2$ gas concentration: 10 to 20 vol %, $N_2$ gas concentration: 15 to 25 vol %; gas pressure: $1.0 \times 10^{-2}$ Pa to $10 \times 10^{-2}$ Pa, preferably $1.0 \times 10^{-2}$ Pa to $5 \times 10^{-2}$ Pa, more preferably $1.0 \times 10^{-2}$ Pa to $3 \times 10^{-2}$ Pa)

Electric power applied: 30 to 1,000 W, preferably 50 to 750 W, more preferably 80 to 500 W Deposition rate: 2.0 to 50 nm/sec, preferably 2.5 to 35 nm/sec, more preferably 5 to 25 nm/sec It is preferred to form the low reflective layer 15 on the absorber layer 14 in the EUV mask blank 1 shown in FIG. 2 because the wavelength of the pattern inspection light and the wavelength of the EUV light are different. Thus, in a case where EUV light (in the vicinity of 13.5 nm) is used as the pattern inspection light, it is considered that it is not necessary to form the low reflective layer 15 on the absorber layer 14. The wavelength of the inspection light tends to shift toward a short wavelength side along with a reduction in the pattern dimension, and it is considered to shift to 193 nm or further to 13.5 nm in future. It is considered that it is not required to form the low reflective layer 15 on the absorber layer 14 when the wavelength of the inspection light is 13.5 nm.

The EUV mask blank 1 of the present invention may have a functional film known in the field of the EUV mask blank, in addition to the reflective layer 12, the protective layer 13 and the absorber layer 14. Specific examples of such a functional film include a highly dielectric coating to be applied on the back side of the substrate to accelerate electrostatic chucking of the substrate as disclosed in JP-A-2003-501823. The back side of the substrate represents a face opposite to the face on which the reflective layer 12 is formed in the substrate 11 in FIG. 1. The electrical conductivity of a constituent material and the thickness of the highly dielectric coating to be applied on the back side of the substrate for the above purpose are selected so that the sheet resistance will be at most 100Ω/□. As the constituent material of the highly dielectric coating can be widely selected from ones disclosed in known literature. For example, a highly dielectric coating as disclosed in JP-A-2003-501823, specifically, a coating comprising silicon, TiN, molybdenum, chromium or TaSi can be applied. The thickness of the highly dielectric coating may, for example, be from 10 to 1,000 nm.

The highly dielectric coating can be formed by a known film deposition method, e.g. sputtering such as magnetron sputtering or ion beam sputtering, a CVD method, a vacuum deposition method or an electrolytic plating method.

The present invention further provides, in addition to the above-described EUV mask blank, a substrate with a reflective film to be used for production of the EUV mask blank, and an EUV mask blank prepared by forming a pattern on the EUV mask blank. The substrate with a reflective film is the above EUV mask blank in a state before an absorber layer is formed, i.e. one shown in FIG. 1 excluding the absorber layer 14.

EXAMPLES

Now, the present invention will be described in further detail with reference to Examples. However, it should be understood that the present invention is by no means restricted to such specific Examples.

Example 1

In this Example, an EUV mask blank 1 shown in FIG. 2 was prepared.

As a substrate 11 for film deposition, a SiO$_2$—TiO$_2$ glass substrate (outer dimensions of 6 inch (152.4 mm) square and a thickness of 6.3 mm) was used. This glass substrate has a coefficient of thermal expansion of 0.2×10$^{-7}$/° C., a Young's modulus of 67 GPa, a Poisson's ratio of 0.17 and a specific rigidity of 3.07×10$^7$ m$^2$/s$^2$. The glass substrate was polished so as to have a smooth surface with rms of at most 0.15 nm and a flatness of at most 100 nm.

On the back side of the substrate 11, a highly dielectric coating (not shown) with a sheet resistance of 100Ω/□ was applied by depositing a Cr film with a thickness of 100 nm by magnetron sputtering.

The substrate 11 (outer dimensions of 6 inch (152.4 mm) square and a thickness of 6.3 mm) was fixed to a conventional electrostatic chuck in a flat plate shape using the formed Cr film, and a cycle comprising alternately depositing Si films and Mo films on the surface of the substrate 11 by ion beam sputtering was repeated 40 times to form a Si/Mo reflective multilayer film (reflective layer 12) having a total film thickness of 272 nm ((4.5 nm±2.3 nm)×40). The uppermost layer was a Si film for the purpose of preventing oxidation of Mo.

The deposition conditions for the Si films and the Mo films are as follows.

(Deposition Conditions for Si Films)
Target: Si target (doped with boron)
Sputtering gas: Ar gas (gas pressure 0.02 Pa)
Voltage: 700 V
Deposition rate: 0.077 nm/sec
Film thickness: 4.5 nm (Deposition Conditions for Mo Films)
Target: Mo target
Sputtering gas: Ar gas (gas pressure 0.02 Pa)
Voltage: 700 V
Deposition rate: 0.064 nm/sec
Film thickness: 2.3 nm Then, a protective layer 13 comprising a solid solution (A) was formed on the reflective layer 12 by magnetron sputtering.

The deposition conditions for the protective layer 13 are as follows.
Target: Ru target, B target
Sputtering gas: Ar gas (gas pressure 2 mTorr (2.6×10$^{-1}$ Pa))
Output: 30 W (Ru target), RF 250 W (B target)
Deposition rate: 4.8 nm/sec
Film thickness: 2.5 nm The following evaluations were carried out with respect to the protective layer 13 obtained by the above procedure.

(1) Film Composition

The composition of the protective layer 13 was measured by using an X-ray photoelectron spectrometer (manufactured by PERKIN ELEMER-PHI, Number 5,500). The compositional ratio (at %) of the protective layer 13 was Ru:B=87.5:12.5.

(2) Crystal Structure

The crystal structure of the protective layer 13 was confirmed by an X-ray diffractometer (manufactured by Rigaku Corporation). For confirmation of the crystal structure, a film comprising a solid solution (A) with a thickness of 100 nm deposited on a silicon substrate under the above deposition conditions was used. The crystal structure of the protective layer 13 was confirmed to be an amorphous structure or a microcrystal structure since no sharp peak was observed in the obtained diffraction peak. Further, a heating test was carried out in vacuum (at most 1 Pa) and as a result, the amorphous structure or the microcrystal structure was maintained up to 200° C.

(3) Surface Roughness

The surface roughness of the protective layer 13 was confirmed by using an atomic force microscope (manufactured by Seiko Instruments Inc., number SPI3800) in accordance with JIS-B0601 (1994). The surface roughness of the protective layer 13 was 0.15 nm rms.

(4) EUV Resistance

The protective layer 13 was irradiated with EUV light (synchrotron radiation) at an angle of incidence θ (6°) for 8 hours. After the irradiation with EUV light, the decrease in the EUV reflectance was at most 0.5%.

Then, a TaBSiN layer was formed as an absorber layer 14 on the protective layer 13 by magnetron sputtering.

The deposition conditions for the TaBSiN layer are as follows.

(Deposition Conditions for TaBSiN Layer)
Target: TaBSi compound target (compositional ratio: Ta 80 at %, B 10 at %, Si 10 at %)
Sputtering gas: gas mixture of Ar and N$_2$ (Ar: 86 vol %, N$_2$: 14 vol %, gas pressure: 0.3 Pa)
Electric power applied: 150 W
Deposition rate: 7.4 nm/sec
Film thickness: 60 nm The following evaluations were carried out with respect to the absorber layer 14 (TaBSiN layer) obtained by the above procedure.

(1) Film Composition

The composition of the absorber layer 14 (TaSiBN layer) was measured by using an X-ray photoelectron spectrometer (manufactured by PERKIN ELEMER-PHI, Number 5,500). The compositional ratio (at %) of the absorber layer 14 was Ta:B:Si:N=70:3:10:17.

(2) Crystal Structure

The crystal structure of the absorber layer 14 (TaSiBN film) was confirmed by an X-ray diffractometer (manufactured by Rigaku Corporation). The crystal structure of the absorber layer 14 was confirmed to be an amorphous structure or a microcrystal structure since no sharp peak was observed in the obtained diffraction peak.

(3) Surface Roughness

The surface roughness of the absorber layer 14 (TaSiBN film) was confirmed by using an atomic force microscope (manufactured by Seiko Instruments Inc., Number SPI3800) in accordance with JIS-B0601 (1994). The surface roughness of the absorber layer 14 was 0.15 nm rms.

Finally, a TaBSiON layer is formed as a low reflective layer 15 on the absorber layer 14 to obtain an EUV mask blank 1 comprising the substrate 11 and the reflective layer 12, the protective layer 13, the absorber layer 14 and the low reflective layer 15 formed in this order on the substrate.

The deposition conditions for the TaBSiON layer are as follows.

(Deposition Conditions for TaBSiON Layer)
Target: TaBSi target (compositional ratio: Ta 80 at %, B 10 at %, Si 10 at %)

Sputtering gas: gas mixture of Ar, $N_2$ and $O_2$ (Ar: 60 vol %, $N_2$: 20 vol %, $O_2$: 20 vol %; gas pressure: 0.3 Pa)
Electric power applied: 150 W
Deposition rate: 11 nm/sec
Film thickness: 10 nm The compositional ratio of the low reflective layer 15 obtained by the above procedure was measured by using an X-ray photoelectron spectrometer (manufactured by PERKIN ELMER-PHI, Number 5,500) and as a result, Ta:B:Si:N:O=40:3:10:10:37.

Reflection Properties (Evaluation of Contrast)

After the protective layer 13 was formed, the reflectance to pattern inspection light (wavelength 257 nm) on the surface of the protective layer 13 was measured by a spectrophotometer. Further, after the low reflective layer 15 (TaBSiON layer) was formed, the reflectance to pattern inspection light on the surface of the low reflective layer 15 was measured. As a result, the reflectance was 60.0% on the surface of the protective layer 13 and the reflectance was 6.9% on the surface of the low reflective layer 15. The contrast was determined from the above results and from the above-described formula and as a result, it was 79.4%.

Etching Properties

The etching properties were evaluated by the following method instead of evaluation using the EUV mask blank prepared by the above procedure.

A Si chip (1) (10 mm×30 mm) having a film comprising a solid solution (A) deposited thereon and a Si chip (2) (10 mm×30 mm) having a TaBSiON film deposited thereon as samples were placed on a sample support (4 inch quartz substrate) of a RF plasma etching apparatus. In such a state, plasma etching (RF plasma etching) was carried out on the film comprising a solid solution (A) and the TaBSiN film on the Si chips placed on the sample support under the following conditions.

Bias RF: 50 W
Etching time: 120 sec
Trigger pressure: 3 Pa
Etching pressure: 1 Pa
Etching gas: $Cl_2$/Ar
Gas flow rate ($Cl_2$/Ar): 20/80 sccm
Distance between electrode substrates: 55 mm The film comprising a solid solution (A) and the TaBSiN film were deposited by magnetron sputtering in the same manner as above. The etching rates were obtained with respect to the film comprising a solid solution (A) and the TaBSiN film to determine the etching selectivity using the following formula.

Etching selectivity=(etching rate of TaBSiN film)/
(etching rate of film comprising a solid solution
(A))

In the case of plasma etching, the etching selectivity of the absorber layer 14 to the protective layer 13 is preferably at least 10. The etching selectivity of the TaBSiN film to the film comprising a solid solution (A) was 15, which was a sufficient etching selectivity.

Example 2

In Example 2, the same operation as in Example 1 was carried out except that the protective layer 13 comprising a solid solution (B) was formed. The protective layer 13 comprising a solid solution (B) was deposited by magnetron sputtering under the following conditions.

(Deposition Conditions for Protective Layer 13)
Target: Ru target, Zr target
Sputtering gas: Ar gas (gas pressure: 2 mTorr ($2.6 \times 10^{-1}$ Pa))
Output: 150 W (Ru target), 100 W (Zr target)
Deposition rate: 18.2 nm/sec
Film thickness: 2.5 nm The following evaluations were carried out with respect to the protective layer 13 obtained by the above procedure.

(1) Film Composition

The composition of the protective layer 13 was measured by using an X-ray photoelectron spectrometer (manufactured by PERKIN ELMER-PHI, Number 5,500). The compositional ratio (at %) of the protective layer 13 was Ru:Zr=80.4:19.6.

(2) Crystal Structure

The crystal structure of the protective layer 13 was confirmed by an X-ray diffractometer (manufactured by Rigaku Corporation). For confirmation of the crystal structure, a film comprising a solid solution (B) with a thickness of 100 nm deposited on a silicon substrate under the above deposition conditions was used. The crystal structure of the protective layer 13 was confirmed to be an amorphous structure or a microcrystal structure since no sharp peak was observed in the obtained diffraction peak. Further, a heating test was carried out under a pressure of at most 1 Pa and as a result, the amorphous structure or the microcrystal structure was maintained up to 400° C.

(3) Surface Roughness

The surface roughness of the protective layer 13 was confirmed by using an atomic force microscope (manufactured by Seiko Instruments Inc., Number SPI3800) in accordance with JIS-B0601 (1994). The surface roughness of the protective layer 13 was 0.15 nm rms.

(4) EUV Resistance

The protective layer 13 was irradiated with EUV light (synchrotron radiation) at an angle of incidence θ (6°) for the same time period as in Example 1. After the irradiation with EUV light, the decrease in the EUV reflectance was at most 0.5%.

(5) Reflection Properties

The reflectances to pattern inspection light (wavelength 257 nm) on the surface of the protective layer 13 and the low reflective layer 15 (TaBSiON layer) were measured in the same manner as in Example 1. As a result, the reflectance was 60.0% on the surface of the protective layer 13 and the reflectance was 6.9% on the surface of the low reflective layer 15. The contrast was determined from the above results and from the above-described formula and as a result, it was 79.4%.

(6) Etching Properties

With respect to the film comprising a solid solution (B), the etching properties were evaluated in the same manner as above. As a result, the etching selectivity of the TaBSiN film to the film comprising a solid solution (B) was 11.5, which was a sufficient etching selectivity.

Comparative Example 1

In Comparative Example 1, the same operation as in Example 1 was carried out except that a film comprising a solid solution (A) with a B content less than 5 at % was used as the protective layer 13. The protective layer 13 was formed under the following conditions.

(Formation Conditions for Protective Layer 13)
  Target: Ru target, B target
  Sputtering gas: Ar gas (gas pressure: 2 mTorr ($2.6 \times 10^{-1}$ Pa))
  Output: 30 W (Ru target), RF150 W (B target)
  Deposition rate: 4.8 nm/sec
  Film thickness: 2.5 nm The composition of the obtained protective layer 13 was measured by using an X-ray photoelectron spectrometer (manufactured by PERKIN ELEMER-PHI, Number 5,500). The compositional ratio (at %) of the protective layer 13 was Ru:B=95.2:4.8.

The crystal structure of the obtained protective layer 13 was confirmed by an X-ray diffractometer and as a result, the protective layer 13 was confirmed to be crystalline since a sharp peak was observed in the obtained diffraction peak. For confirmation of the crystal structure, a film comprising a solid solution (A) with a thickness of 100 nm deposited on a silicon substrate under the above conditions was used.

The EUV resistance was examined with respect to the obtained protective layer 13 in the same manner as in Example 1 and as a result, the reflectance decreased by 2% after irradiation for the same time period as in Example 2, whereby the protective layer 13 was confirmed to be poor in the EUV resistance.

Comparative Example 2

In Comparative Example 2, the same operation as in Example 1 was carried out except that a film comprising a solid solution (A) with a B content exceeding 30 at % was used as the protective layer 13, but no protective layer 13 could be formed.

(Formation Conditions for Protective Layer 13)
  Target: Ru target, B target
  Sputtering gas: Ar gas (gas pressure: 2 mTorr ($2.6 \times 10^{-1}$ Pa))
  Output: 30 W (Ru target), RF400 W (B target)
  Deposition rate: 5.0 nm/sec
  Film thickness: 2.5 nm Comparative Example 3

In Comparative Example 3, the same operation as in Example 2 was carried out except that a film comprising a solid solution (B) with a Zr content less than 5 at % was used as the protective layer 13. The protective layer 13 was formed under the following conditions.

(Formation Conditions for Protective Layer 13)
  Target: Ru target, Zr target
  Sputtering gas: Ar gas (gas pressure: 2 mTorr ($2.6 \times 10^{-1}$ Pa))
  Output: 150 W (Ru target), 50 W (Zr target)
  Deposition rate: 15.8 nm/sec
  Film thickness: 2.5 nm The composition of the obtained protective layer 13 was measured by using an X-ray photoelectron spectrometer (manufactured by PERKIN ELEMER-PHI, Number 5,500). The compositional ratio (at %) of the protective layer 13 was Ru:Zr=96:4.

The crystal structure of the obtained protective layer 13 was confirmed by an X-ray diffractometer and as a result, the protective layer 13 was confirmed to be crystalline since a sharp peak was observed in the obtained diffraction peak. For confirmation of the crystal structure, a film comprising a solid solution (B) with a Zr content less than 5 at % with a thickness of 100 nm deposited on a silicon substrate under the above conditions was used.

The EUV resistance was examined with respect to the obtained protective layer 13 in the same manner as in Example 2 and as a result, the reflectance decreased by 2% after irradiation for the same time period as in Example 1, whereby the protective layer 13 was confirmed to be poor in the EUV resistance.

Comparative Example 4

In Comparative Example 4, the same operation as in Example 2 was carried out except that a film comprising a solid solution (B) with a Zr content exceeding 30 at % was used as the protective layer 13. The protective layer 13 was formed under the following conditions.

(Formation Conditions for Protective Layer 13)
  Target: Ru target, Zr target
  Sputtering gas: Ar gas (gas pressure: 2 mTorr ($2.6 \times 10^{-1}$ Pa))
  Output: 24 W (Ru target), 150 W (Zr target)
  Deposition rate: 10.9 nm/sec
  Film thickness: 2.5 nm The composition of the obtained protective layer 13 was measured by using an X-ray photoelectron spectrometer (manufactured by PERKIN ELEMER-PHI, Number 5,500). The compositional ratio (at %) of the protective layer 13 was Ru:Zr=58:42.

With respect to the film comprising a solid solution (B) with a Zr content exceeding 30 at %, the etching properties were evaluated in the same manner as above. As a result, the etching selectivity of the TaBSiN film to the film comprising a solid solution (B) was 5.6, which was an insufficient etching selectivity.

Comparative Example 5

In Comparative Example 5, the same operation as in Example 2 was carried out except that a film containing Ru and Ti was used as the protective layer 13. The sputtering was carried out under the following three target output conditions so as to adjust the Ti content in the protective layer 13.

(Formation Conditions for Protective Layer 13)
  Target: Ru target, Ti target
  Sputtering gas: Ar gas (gas pressure: 2 mTorr ($2.6 \times 10^{-1}$ Pa))
  Output condition (1): 150 W (Ru target), 50 W (Ti target)
  Output condition (2): 150 W (Ru target), 100 W (Ti target)
  Output condition (3): 50 W (Ru target), 150 W (Ti target)
  Film thickness: 2.5 nm The crystal structure of the obtained protective layer 13 was confirmed by an X-ray diffractometer and as a result, the protective layer 13 was confirmed to be crystalline since a sharp peak was observed in the obtained diffraction peak. For confirmation of the crystal structure, a film containing Ru and Ti with a thickness of 100 nm deposited on a silicon substrate under the above conditions was used.

Comparative Example 6

In Comparative Example 6, the same operation as in Example 2 was carried out except that a film containing Ru and Mo was used as the protective layer 13. The sputtering was carried out under the following three target output conditions so as to adjust the Mo content in the protective layer 13.

(Formation Conditions for Protective Layer 13)
Target: Ru target, Mo target
Sputtering gas: Ar gas (gas pressure: 2 mTorr ($2.6\times10^{-1}$ Pa))
Output condition (1): 150 W (Ru target), 50 W (Mo target)
Output condition (2): 150 W (Ru target), 100 W (Mo target)
Output condition (3): 150 W (Ru target), 150 W (Mo target)
Film thickness: 2.5 nm The crystal structure of the obtained protective layer 13 was confirmed by an X-ray diffractometer and as a result, the protective layer 13 was confirmed to be crystalline since a sharp peak was observed in the obtained diffraction peak. For confirmation of the crystal structure, a film containing Ru and Mo with a thickness of 100 nm deposited on a silicon substrate under the above conditions was used.

Comparative Example 7

In Comparative Example 7, the same operation as in Example 2 was carried out except that a film containing Ru and Nb was used as the protective layer 13. The sputtering was carried out under the following three target output conditions so as to adjust the Nb content in the protective layer 13.

(Formation Conditions for Protective Layer 13)
Target: Ru target, Nb target
Sputtering gas: Ar gas (gas pressure: 2 mTorr ($2.6\times10^{-1}$ Pa))
Output condition (1): 150 W (Ru target), 30 W (Nb target)
Output condition (2): 150 W (Ru target), 50 W (Nb target)
Output condition (3): 150 W (Ru target), 100 W (Nb target)
Film thickness: 2.5 nm The crystal structure of the obtained protective layer 13 was confirmed by an X-ray diffractometer and as a result, the protective layer 13 was confirmed to be crystalline since a sharp peak was observed in the obtained diffraction peak. For confirmation of the crystal structure, a film containing Ru and Nb with a thickness of 100 nm deposited on a silicon substrate under the above conditions was used.

The entire disclosure of Japanese Patent Application No. 2006-159414 filed on Jun. 8, 2006 including specification, claims, drawings and summary is incorporated herein by reference in its entirety.

What is claimed is:

1. A substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); and in the protective layer, the Ru content is from 70 at % to 95 at % and the total content of B and Zr is from 5 at % to 30 at %.

2. The substrate with a reflective layer for EUV lithography according to claim 1, wherein the protective layer comprises any one of the following solid solutions:
a solid solution of Ru and B,
a solid solution of Ru and Zr, and
a solid solution of Ru, B and Zr.

3. The substrate with a reflective layer for EUV lithography according to claim 2, wherein the protective layer contains Ru and B, and the protective layer keeps being in an amorphous state up to 200° C. in vacuum (at most 1 Pa).

4. The substrate with a reflective layer for EUV lithography according to claim 2, wherein the protective layer contains Ru and Zr, and the protective layer keeps being in an amorphous state up to 400° C. in vacuum (at most 1 Pa).

5. The substrate with a reflective layer for EUV lithography according to claim 1, wherein the protective layer is in an amorphous state.

6. The substrate with a reflective layer for EUV lithography according to claim 1, wherein the surface roughness on the surface of the protective layer is at most 0.5 nm rms.

7. The substrate with a reflective layer for EUV lithography according to claim 1, wherein the protective layer has a thickness of from 1 to 10 nm.

8. A reflective mask blank for EUV lithography, comprising the substrate with a reflective layer for EUV lithography as defined in claim 1, and an absorber layer formed on the protective layer of the substrate.

9. The reflective mask blank for EUV lithography according to claim 8, wherein the absorber layer is made of a material containing tantalum (Ta) as the main component.

10. The reflective mask blank for EUV lithography according to claim 8, wherein the etching selectivity of the absorber layer to the protective layer is at least 10 in the case of plasma etching.

11. The reflective mask blank for EUV lithography according to claim 8, wherein a low reflective layer to inspection light to be used for inspection of a mask pattern is formed by a material containing tantalum (Ta) as the main component on the absorber layer.

12. The reflective mask blank for EUV lithography according to claim 11, wherein the contrast is at least 30% as between the reflected light on the surface of the protective layer and the reflected light on the surface of the low reflective layer at a wavelength of light to be used for inspection of a pattern to be formed on the absorber layer.

13. A reflective mask for EUV lithography, which is prepared by forming a pattern on the reflective mask blank for EUV lithography as defined in claim 8.

14. A substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); the protective layer is a gradient composition film wherein the total content of B and Zr in the protective layer changes along the thickness direction of the protective layer so that the total content of B and Zr is high on the reflective layer side and the total content of B and Zr is low on the surface side; the total content of B and Zr is from 5 at % to 30 at % on the reflective layer side; and the total content of B and Zr is from 0 at % to 20 at % on the surface side.

15. A substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); in the protective layer, the Ru content is from 70 at % to 95 at % and the total content of B and Zr is from 5 at % to 30 at %; and the protective layer has an amorphous structure.

16. The substrate with a reflective layer for EUV lithography according to claim 15, wherein the protective layer comprises any one of the following solid solutions:

a solid solution of Ru and B, a solid solution of Ru and Zr, and a solid solution of Ru, B and Zr.

17. A substrate with a reflective layer for EUV lithography, comprising a substrate, and a reflective layer for reflecting EUV light and a protective layer for protecting the reflective layer formed in this order on the substrate, wherein the protective layer contains ruthenium (Ru) and at least one element selected from the group consisting of boron (B) and zirconium (Zr); the protective layer is a gradient composition film wherein the total content of B and Zr in the protective layer changes along the thickness direction of the protective layer so that the total content of B and Zr is high on the reflective layer side and the total content of B and Zr is low on the surface side; the total content of B and Zr is from 5 at % to 30 at % on the reflective layer side; the total content of B and Zr is from 0 at % to 20 at % on the surface side; and the protective layer has an amorphous structure.

* * * * *